US012591007B2

(12) United States Patent     (10) Patent No.:   US 12,591,007 B2

Jones     (45) Date of Patent:    Mar. 31, 2026

(54) DETERMINING A CORRELATION BETWEEN POWER DISTURBANCES AND DATA ERRORS IN A TEST SYSTEM

(71) Applicant: Teradyne, Inc., North Reading, MA (US)

(72) Inventor: Christopher C. Jones, Winchester, MA (US)

(73) Assignee: Teradyne, Inc., North Reading, MA (US)

( * ) Notice: Subject to any disclaimer, the term of this patent is extended or adjusted under 35 U.S.C. 154(b) by 383 days.

(21) Appl. No.: 18/079,685

(22) Filed: Dec. 12, 2022

(65) Prior Publication Data

US 2024/0192272 A1    Jun. 13, 2024

(51) Int. Cl.
    G01R 31/317       (2006.01)
    G01R 31/28       (2006.01)

(52) U.S. Cl.
    CPC ... *G01R 31/31721* (2013.01); *G01R 31/2879* (2013.01)

(58) Field of Classification Search
    CPC ...................... G01R 31/31721; G01R 31/2879
    See application file for complete search history.

(56) References Cited

U.S. PATENT DOCUMENTS

| | | | |
|---|---|---|---|
| 7,154,944 B2 | 12/2006 | Jungerman | |
| 8,660,811 B2 | 2/2014 | Miller | |
| 9,746,877 B2 | 8/2017 | Zhou et al. | |
| 11,867,749 B2 | 1/2024 | Pei et al. | |
| 11,899,042 B2 | 2/2024 | Campbell et al. | |
| 2005/0151553 A1* | 7/2005 | Kabbani | G01R 31/2891 |
| | | | 324/750.08 |
| 2009/0167401 A1 | 7/2009 | Jones et al. | |
| 2013/0303098 A1* | 11/2013 | Carlsson | H04B 17/309 |
| | | | 455/226.1 |
| 2014/0210503 A1* | 7/2014 | Tam | G01R 19/0092 |
| | | | 324/754.03 |
| 2017/0160321 A1* | 6/2017 | Held | G01R 15/12 |
| 2017/0163358 A1 | 6/2017 | Wadell et al. | |
| 2018/0285225 A1* | 10/2018 | Kumar | G06F 11/221 |
| 2020/0379036 A1* | 12/2020 | Toyota | G01R 31/31935 |
| 2021/0029014 A1* | 1/2021 | Connolly | H04L 41/0813 |

(Continued)

FOREIGN PATENT DOCUMENTS

| | | |
|---|---|---|
| CN | 111858222 B | 7/2024 |

OTHER PUBLICATIONS

International Search Report and Written Opinion in Application No. PCT/US2023/081606 dated Apr. 1, 2024, 12 pages.

(Continued)

*Primary Examiner* — Catherine T. Rastovski
*Assistant Examiner* — Amma Alexander
(74) *Attorney, Agent, or Firm* — ArentFox Schiff LLP

(57) ABSTRACT

An example system for testing a device under test (DUT) includes one or more processing devices configured to receive first data from the DUT over a communication channel, and to analyze the first data to identify an error associated with the communication channel; and a power supply controller configured to receive second data based on a power disturbance from the DUT, and to compare the first data and the second data to determine if there is a correlation between the power disturbance and the error.

34 Claims, 3 Drawing Sheets

(56)     References Cited

U.S. PATENT DOCUMENTS

2022/0128599  A1     4/2022   Campbell et al.
2023/0251699  A1     8/2023   Acharya et al.

OTHER PUBLICATIONS

Connally et al., "Debugging PCIe Dynamic Link Behaviors with CrossSync PHY for PCIe," Adapted from the webinar How to Debug PCI Express Power Management and Dynamic Link Behaviors by Patrick Connally and Gordon Getty (Nov. 16, 2021), 8 pages.
Tektronix, Bit Error Rate Tester—BitAlyzer® BA Series Datasheet. Mar. 28, 2017. 16 pages.
https://www3.cs.stonybrook.edu/~mdasari/courses/cse570/phy-layer-part2-2up.pdf; dated Sep. 1, 2015 and accessed May 29, 2025; 14 pages.
International Preliminary Report on Patentability received for PCT Patent Application No. PCT/US2023/081606, mailed on Jun. 26, 2025, 8 pages.
Semenov et al., "Advanced correlation method for bit position detection towards high accuracy data processing in industrial computer systems", Information Sciences, vol. 624, May 2023, 12 pages.

* cited by examiner

100

Event Log
108

Processing Device
102

Bit Error
Timestamp

Power Event
Timestamp

Power Supply
Controller
110

Power Log
114

Communication
Channel
106

Device Under
Test
104

Power Supply
112

115

DETERMINING A CORRELATION BETWEEN POWER DISTURBANCES AND DATA ERRORS IN A TEST SYSTEM

TECHNICAL FIELD

The disclosure generally relates to testing a device and, more particularly, to determining if there is a correlation between power disturbances in power provided to the device and bit errors or retry events on a communication channel to the device.

BACKGROUND

Test systems are configured to test the operation of electronic devices referred to as devices under test (DUTs). A test system may include test instruments to send signals, including digital and analog signals, to a DUT for testing. The test system may also include a power supply to supply power to the DUT and a computer bus that is part of a communication channel to communicate with the DUT.

SUMMARY

An example system for testing a device under test (DUT) includes one or more processing devices configured to receive first data from the DUT over a communication channel, and to analyze the first data to identify an error associated with the communication channel; and a power supply controller configured to receive second data based on a power disturbance from the DUT, and to compare the first data and the second data to determine if there is a correlation between the power disturbance and the error. The example system may include one or more of the following features, either alone or in combination.

The system may include a power supply configured to provide power to the DUT. The power disturbance may be based on the power provided to the DUT. The power supply may be configured to operate at voltage levels margined around a nominal voltage of the DUT. The power supply controller may be configured to manage voltage levels at the power supply to initiate the power disturbance. The power supply may be configured to have current limits margined around a maximum current draw of the DUT. The power supply controller may be configured to manage current levels at the power supply to initiate the power disturbance.

The one or more processing devices may be configured to issue commands to the power supply controller to control the power provided by the power supply to the DUT. The power supply controller may be configured to receive the second data from the power supply. The power supply controller may be configured to timestamp the second data. The power supply controller may be configured to send the timestamped second data to the one or more processing devices. The power supply controller may be configured to store the second data in memory.

The one or more processing devices may be configured to store the first data in memory. The one or more processing devices may be configured to timestamp the first data. The one or more processing devices may be configured to send the time-stamped first data to the power supply controller. The error from the communication channel may include one or more bit errors. The one or more processing devices may be configured to use bit error testing to test for the one or more bit errors. The communication channel may include a peripheral component interconnect express (PCIe) bus or Ethernet.

The power supply controller may be configured to produce a predetermined power perturbation at the DUT that is time-stamped. The power disturbance may correspond to the predetermined power perturbation. The second data may be based on the predetermined power perturbation. The one or more processing devices may be configured to control an ambient temperature around the DUT so that the ambient temperature changes from below freezing to above freezing but below a maximum operating temperature of the DUT. The one or more processing devices may be configured to control a bandwidth of the first data in order to detect correlations between power disturbances and errors in the communication channel based on the bandwidth of the first data.

An example method for testing a device under test (DUT) includes receiving first data from the DUT over a communication channel; analyzing the first data to identify an error associated with the communication channel; receiving second data based on a power disturbance from the DUT; and comparing the first data and the second data to determine if there is a correlation between the power disturbance and the error. The example method may include one or more of the following features, either alone or in combination.

The method may include providing power, using a power supply, to the DUT. The power disturbance may be based on the power provided to the DUT. Providing power to the DUT may include operating the power supply at voltage levels margined around a nominal voltage of the DUT. Receiving the second data may include managing voltage levels at the power supply to initiate the power disturbance. The power supply may be configured to have current limits margined around a maximum current draw of the DUT.

The method may include managing current levels at the power supply to initiate the power disturbance. The method may include issuing commands to a power supply controller to control the power provided by the power supply to the DUT. The method may include receiving the second data from the power supply. The method may include timestamping the second data. The method may include sending, using the power supply controller, the timestamped second data to the one or more processing devices. The method may include storing, using the power supply controller, the second data in memory.

The method may include storing the first data in memory. The method may include timestamping the first data. The method may include sending the time-stamped first data to the power supply controller. The error from the communication channel may include one or more bit errors. The method may include testing, using bit error testing, for the one or more bit errors.

The communication channel may include a peripheral component interconnect express (PCIe) bus or Ethernet. The method may include producing a predetermined power perturbation at the DUT that is time-stamped. The power disturbance may correspond to the predetermined power perturbation and the second data being based on the predetermined power perturbation. The method may include controlling an ambient temperature around the DUT so that the ambient temperature changes from below freezing to above freezing but below a maximum operating temperature of the DUT.

Comparing the first data and the second data may include controlling a bandwidth of the first data in order to detect correlations between power disturbances and errors in the communication channel based on the bandwidth of the first data.

Any two or more of the features described in this specification, including in this summary section, may be combined to form implementations not specifically described in this specification.

At least part of the devices, systems, and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the devices, systems, and processes described in this specification may be configured or controlled using a computing system comprised of one or more processing devices and memory storing instructions that are executable by the one or more processing devices to perform various control operations. The devices, systems, and processes described in this specification may be configured, for example, through design, construction, composition, arrangement, placement, programming, operation, activation, deactivation, and/or control.

The details of one or more implementations are set forth in the accompanying drawings and the following description. Other features and advantages will be apparent from the description and drawings, and from the claims.

DETAILED DESCRIPTION

An example testing system is configured to determine if there is a correlation between power disturbances in power provided to a DUT and bit errors or retry events on a communication channel to the DUT. The example testing system includes one or more processing devices and a power supply controller, which may be part of the one or more processing devices or a separate hardware device from the one or more processing devices. The one or more processing devices are configured to send test data to the DUT via a communication channel and to identify bit errors and/or retry events in responses transmitted by the DUT to the test data. The one or more processing devices are configured to timestamp data representing the bit errors and/or retry events and to store the timestamped data in memory. The power supply controller is configured to monitor power disturbances associated with a power supply that supplies power to the DUT. The power supply controller is configured to timestamp data representing power disturbances and to store the timestamped data in memory. The one or more processing devices are also configured to compare the timestamped data representing the bit errors and/or retry events and the timestamped data representing the power disturbances in order to determine if there is a correlation between the power disturbances and bit errors/retry events. The one or more processing devices are configured to store data indicating whether a correlation has been identified and/or output a notification to a user or computer program based on whether the correlation has been identified or not identified.

Figure 1:
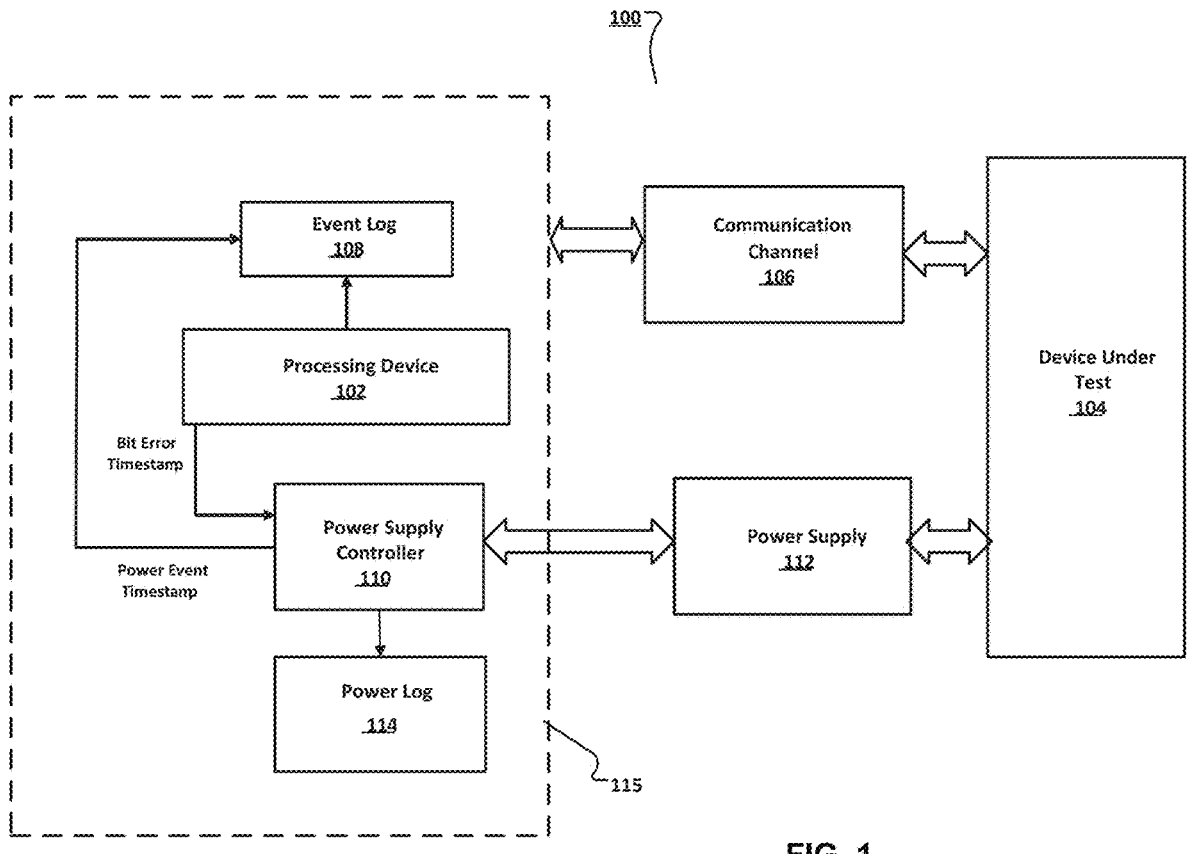
FIG. 1 is a block diagram showing components of an example testing system for testing a DUT.
Figure 3:
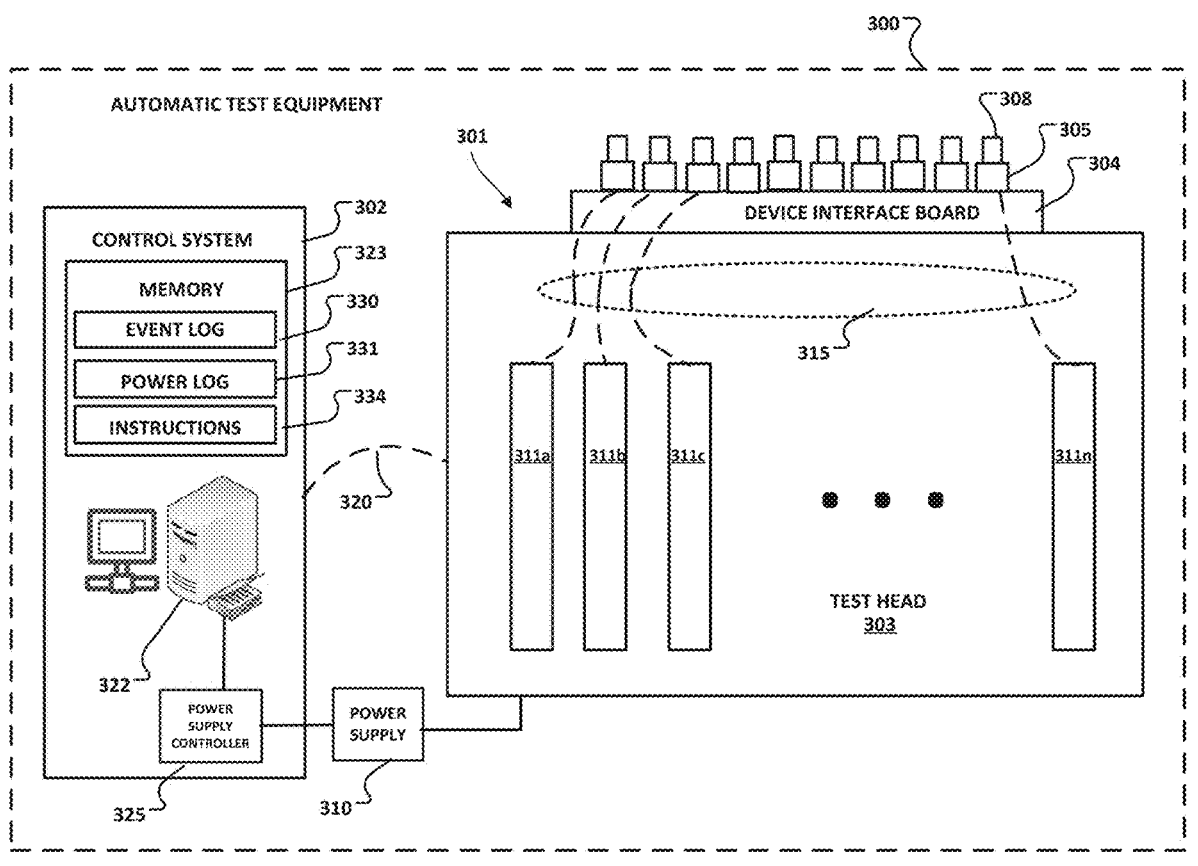
FIG. 3 is a block diagram showing an example testing system

FIG. 1 is a block diagram of example components 100 of a testing system configured to test a DUT 104. Components 100 may be part of automatic test equipment (ATE) 300, an example of which is shown in FIG. 3 (described below). The components include processing device 102, communication channel 106, event log 108, power supply controller 110, power supply 112, and power log 114. Processing device 102, power supply controller 110, event log 108, and power log 114 may be part of—for example included on—a test instrument that performs testing on a DUT or they may be part of a control system that controls operation of the test system. In some implementations, each test instrument in a test system may include an instance of processing device 102, power supply controller 110, event log 108, and power log 114.

Processing device 102 may include one or more processing devices of the same or of different types, as described herein. For example, processing device 102 may include one or more microprocessors and/or a programmable integrated circuit having processing capabilities, such as a field-programmable gate array (FPGA).

Components 100 may include one or more temperature control devices (not shown) that are controllable in response to commands from the processing device. The temperature control devices may include one or heaters to increase an ambient temperature at the testing system and/or at the DUT. The temperature control devices may include one or cooling devices, such as a fan or a Peltier device, to decrease an ambient temperature at the testing system and/or at the DUT. The one or more heating devices may be configured to bring the ambient temperature at the testing system and/or at the DUT to above freezing (32° Fahrenheit/0° Celsius). The one or more cooling devices may be configured to bring the ambient temperature at the testing system and/or at the DUT to below freezing. Processing device 102 is configured—for example, programmed—to control the temperature control devices.

Communication channel 106 includes one or more paths of communication between DUT 104 and the testing hardware. In some examples, a communication channel may include the physical transmission medium or media over which test data is sent to a DUT and over which responses are received from the DUT. Physical transmission media may include, but are not limited to, electrical conductors alone or in combination with optical conductors, wireless transmission media, or both optical conductors and wireless transmission media. For example, the communication channel may be or include a high-speed serial bus, such as a peripheral component interconnect express (PCIe) bus, a PCI bus, or an I2C (Inter-Integrated Circuit, I-squared-C) bus. Other types of buses than these listed may be part of the communication channel. The communication channel may be or include Ethernet. In some examples, a communication channel may include a range of frequencies over which signals are transmitted over a single transmission medium or over multiple transmission media of same or different types. Any number of communication channels may be included in a test system, e.g. one or more test channels per DUT to be tested.

DUT 104 may be or include any type of electronic device that requires testing. DUT 104 may be or include a storage device, such as solid-state drive (SSD) or hard disk drive (HDD). DUT 104 may be a memory device, such as random-access memory (RAM) or read-only memory (ROM). DUT 104 may be a high-performance computing (HPC) device, an input/output (I/O) device, such as a video card, keyboard, or computer monitor. DUT 104 may be an integrated circuit. Other types of DUTs not listed herein may tested by the test system.

Power supply controller 110 may be or include a programmable hardware device, such as one or more microprocessors or other types of processing device described herein. Power supply controller 110 may be or include one or more software modules that execute on processing device 102. Power supply controller 110 may include software components executing on processing device 102 and a dedicated hardware device that operates in response to signals from the one or more software components. Power supply controller 110 may include a direct connection to, or a network connection to, power supply 112. For example, power supply controller 110 may include a computer bus connection to the power supply.

Power supply controller 110 is configured to—for example programmed to—manage voltage and/or current levels output by power supply 112 to the DUT. For example, power supply controller 110 may be configured to send instructions to power supply 112 and, in response, power supply 112 may adjust its voltage and/or current output to the DUT based on those instructions. For example, power supply 112 may increase or decrease its power, voltage, and/or current output to the DUT based on those instructions. Power supply controller 110 is also configured to monitor power, voltage, and/or current levels output by power supply 112 to the DUT. For example, power supply controller may be configured to send instructions to power supply 112 requesting the present or prior power output, voltage output, and/or current output of the power supply 112 to the DUT 104 and, in response, the power supply 112 may respond with the requested information.

Power supply 112 may be a programmable power supply. For example, power supply 112 may include on-board intelligence, such as one or more processing devices of the type described herein to enable the foregoing types of interactions with the power supply controller 110 and/or other components of the test system, such as processing device 102. The on-board intelligence may be configured to receive one or more commands from an external device and to set and reset voltage, current, and power output levels from power supply 112 based on the commands. Power supply 112 may be configured to operate at voltage levels margined around a nominal operating voltage of the DUT 104 or a maximum operating voltage of the DUT. In an example, the operating voltage of the DUT includes a voltage required for normal DUT operation and the maximum operating voltage of the DUT includes the maximum voltage that the DUT can tolerate before damage to the DUT occurs. Power supply 112 may be configured to operate at current levels margined around a nominal current draw of the DUT 104 or a maximum current draw of the DUT. In an example, the nominal current draw of the DUT includes a current draw of the DUT that occurs during normal DUT operation and the maximum current draw of the DUT includes the maximum current that the DUT can tolerate before damage to the DUT occurs.

The testing system also includes computer memory, which may be comprised of one or more machine-readable storage devices configured to store data. The memory may be internal to or external to processing device 102 and/or internal to or external to power controller 110. The computer memory may store error event log 108. The error event log 108 may be or include a database that stores timestamped data of the type described below. The error event log may be configured for access by processing device 102 and/or power controller 110. The computer memory may also store power log 114. The power log 114 may be or include a database that stores timestamped data of the type described below. The power log 114 may be configured for access by processing device 102 and/or power controller 110.

Figure 2:
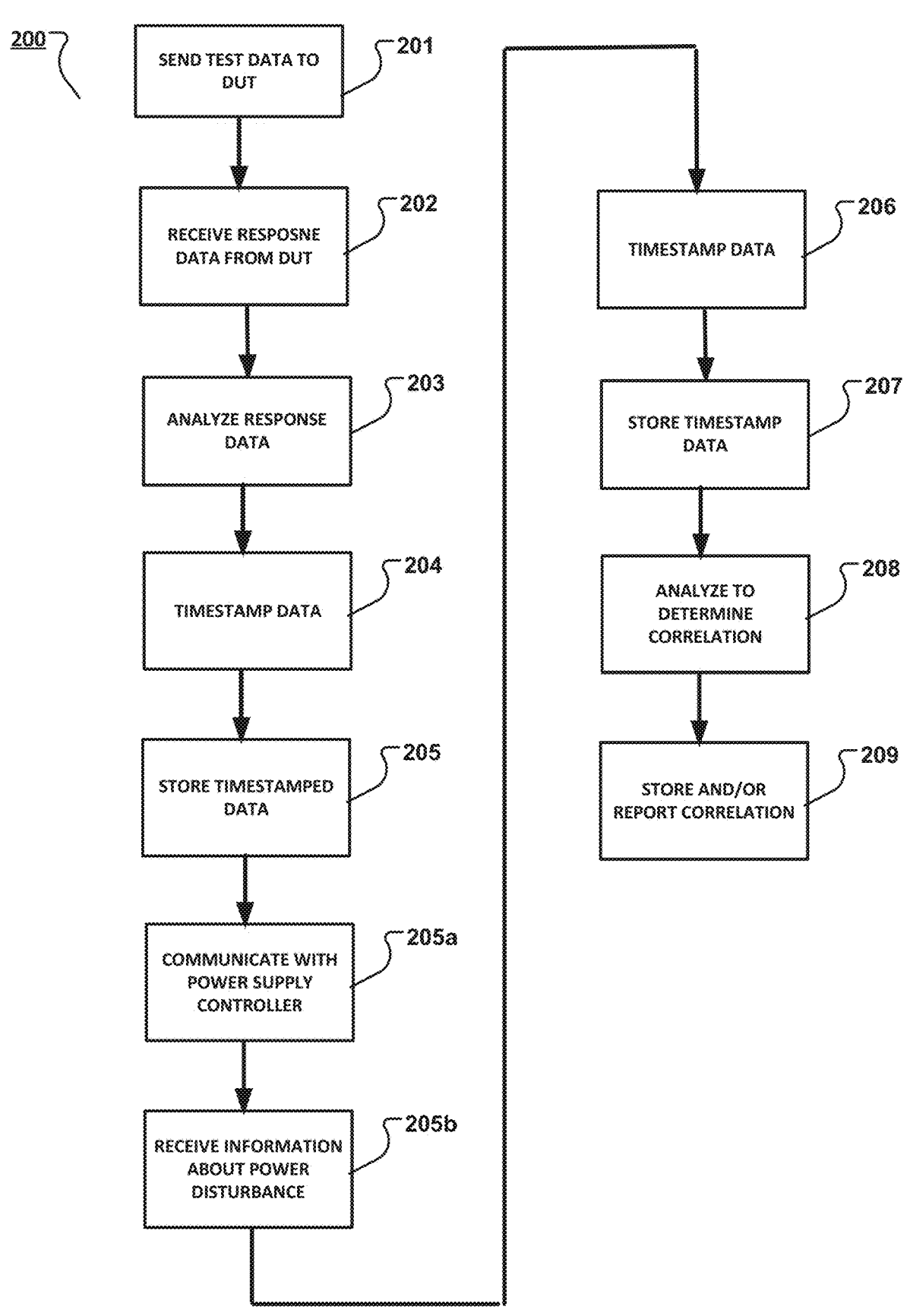
FIG. 2 is a flowchart of an example method for testing a DUT that includes correlating disturbances in power to the DUT with bit errors and retry events on a communication channel to the DUT.

FIG. 2 shows an example process 200 for determining if there is a correlation between power disturbances in power provided to the DUT and bit errors and/or retry events produced by the DUT. In some implementations, process 200 may be implemented by processing device 102 in conjunction with power controller 110.

Process 200 includes processing device 102 sending (201) test data to DUT 104 over communication channel 106. The test data may include test patterns designed to elicit responses from components of the DUT. The responses include response data that the DUT sends back over communication channel 106 in reply to the test data. The response data may represent operation of the DUT or individual components thereof based on application of the test data to the DUT. The response data may include data packets each comprised of multiple bits in some examples.

In some implementations, processing device 102 is configured to control the ambient temperature at or around the DUT so that the ambient temperature changes from below freezing to above freezing but below a maximum operating temperature of the DUT, or vice versa. For example, processing device may send commands to the temperature control device(s) to implement the temperature changes. The ambient temperature may affect the operation of DUT. Changes in operation of the DUT may be reflected by the number and/or types of bit errors in the response data.

Process 200 receives (202) the response data and analyzes (203) the response data to identify bit errors and/or retry events in the response data. Regarding identifying a retry event, transient faults can result from momentary loss of network connectivity or timeouts that occur when a service is busy, for example. In the event of such an occurrence, the DUT may retry sending the response data. This retry is called a retry event. A retry event may be detected based on information contained in the data packet header or body, for example, identifying the packet as a retransmission or a previously transmitted data packet.

Regarding identifying a bit error, there are various ways of detecting bit errors in a data transmission. For example, each data packet in the response data may include an added "parity" bit so that the sum of the bits is always odd or even. If processing device 102 determines that a data packet in the response data includes an improper number of bits, then a bit error is detected. In another example, assume that the response data includes a sequence of bytes. Before transmission, a checksum byte or fixed number of bytes is determined and appended to the message. Processor 102 may perform the same calculation on the received message minus the checksum byte or bytes. The result of this calculation is checked against the received checksum and if they agree, then it is assumed that the message is error free. If they do not agree, then a bit error is detected. For example, higher data rate, low latency versions of PCIe support these bit error detection methods when implementing Forward Error Correction (FEC) where redundant data is transmitted with a checksum used to detect and separate errors from valid data. In another example, PCIe data transmission uses encoding schemes such as 8 bit to 10 bit (8b/10b) or 128 bit to 132 bit (128b/132b) methods. An invalid 10 bit or 128 bit code, respectively, can indicate a bit error. Bit error testing methods other than these may also be used.

When processing device 102 detects bit errors and/or retry events from DUT 104, processing devices timestamps (204) data representing each bit error and/or retry event. In an example, timestamping may include adding data representing a time that the bit error and/or retry event was detected and/or occurred to data representing the bit error and/or retry event, respectively. In another example, timestamping may include storing data representing the time that the bit error and/or retry event was detected and/or occurred in association with the data representing the bit error and/or retry event (e.g., in a look-up table). Any appropriate method of timestamping may be used. The timestamped data may be stored (205) in error event log 108.

Processing device 102 communicates (205*a*) with power supply controller 114 to control and/or to monitor power output to DUT 104 from power supply 112. To control the power output for example, the processing device 102 may issue one or more commands to the power supply controller 110 to control the magnitude and/or duration of power provided by the power supply 112 to DUT 104. In response, power supply controller 110 may issue commands to power supply 112 to provide power to the DUT in accordance with the instruction(s) provided by processing device 102. To monitor the power output for example, the processing device 102 may issue one or more commands to the power supply controller 110 to obtain the amount or level (e.g., magnitude, duration, or other attributes) of power provided by the power supply 112 to DUT 104. In response, power supply controller 110 may issue commands to power supply 112 to obtain the amount or level of power that the power supply has provided to the DUT over a period of time, at a particular instant in the past, or presently.

Process 200 includes receiving (205*b*), from power supply 112, information about a power disturbance in power supply 112. Operation 205*b* may be performed by the power supply controller alone or in communication with processing device 102. This information may be received in response to the one or more commands issued by power supply controller 110 to power supply 112 or this information may be received by power supply controller 110 unsolicited from power supply 112. A power disturbance may be based on power perturbations (referred to herein simply as "perturbation") experienced by power supply 112 while delivering power to DUT 104. A perturbation may include any deviation in power output from the power supply to the DUT that is beyond the norm or beyond an acceptable range of operation of the power supply when providing power to the DUT. For example, power supply 112 is margined for operation around a nominal power of the DUT (referred to herein as "$P_{nominal}$"). In this example, a perturbation may be defined as a deviation from $P_{nominal}$ by ±1% of $P_{nominal}$, by ±2% of $P_{nominal}$, by ±3% of $P_{nominal}$, by ±4% of $P_{nominal}$, by ±5% of $P_{nominal}$, by ±6% of $P_{nominal}$, by ±7% of $P_{nominal}$, by ±8% of $P_{nominal}$, by ±9% of $P_{nominal}$, by ±10% of $P_{nominal}$, by ±20% of $P_{nominal}$, or more over a prescribed period of time or at an instant in time. Other values may be used to define perturbation.

The power disturbances may be naturally occurring or forced. A power disturbance is said to be naturally occurring if the power disturbance is not forced by the power supply controller 110. That is, the power disturbance is naturally occurring if the power disturbance is a result of perturbation of the power supply independent of commands or controls provided to the power supply 112 or other device external to the power supply. A power disturbance is said to be forced when the power supply controller 110 or other device external to the power supply issues one or more commands to power supply 112 to produce a power disturbance that is outside of an acceptable range around the nominal power of the DUT. In some implementations, forced power disturbances are predetermined in the sense that they are based on instructions from the power supply controller 110, from processor 102, or from other components of the testing system. Forced power disturbances may be useful because they are controllable. That is, the timing and magnitude of forced power disturbances are known and controllable and, therefore can be used to cause specific bit errors on the communication channel that are detectable as described herein.

The information received (205*b*) about the power disturbances may include, for example, the time that the power disturbance occurred, the duration of the power disturbance, the magnitude(s) (including voltage and/or current levels) of the power disturbance, or any other appropriate information about the power disturbance that is available to the power supply controller. Data representing attributes such as these make up the information describing the power disturbance.

Process 200 timestamps (206) the data representing the power disturbances. Operation 206 may be performed by the power supply controller 110 alone or in communication with processing device 102. In an example, timestamping may include adding data representing a time that the power disturbance was detected and/or occurred to data representing the power disturbance. In another example, timestamping may include storing data representing the time that the power disturbance was detected and/or occurred in association with the data representing power disturbance (e.g., in a look-up table). Any appropriate method of timestamping may be used. The timestamped data may be stored (207) in power log 114. Operation 207 may be performed by the power supply controller 110 alone or in communication with processing device 102.

Following detection and timestamping of a predetermined number of (e.g., a statistically significant number) of power disturbances and bit errors/retry events, process 200 may analyze (208) the timestamped power disturbances and the timestamped bit errors/retry events to determine if a correlation exists between the timestamped power disturbances and the timestamped bit errors/retry events. For example, processing device 102 may keep track of the number of bit errors/retry events and power disturbances that were identified, timestamped, and stored. Processing device 102 may retrieve data representing the timestamped bit errors and/or retry events directly from event log 108. Processing device 102 may retrieve data representing the timestamped power disturbances by requesting that data from power supply controller 110, which retrieves that data directly from power log 114. Alternatively, processing device 102 may retrieve data representing the timestamped power disturbances directly from power log 114.

The analysis (208) may include a correlation analysis performed during a predefined time window. The time window may be programmed into processing device 102 beforehand or determined dynamically based on prior bit error/retry event and power disturbance measurements. Processing device 102 may use any appropriate statistical correlation technique to determine the correlation, or lack thereof, between bit errors/retry events and power disturbances. A forced power disturbance may enable process 200 to perform a better correlation between bit errors/retry events and power disturbance because the magnitude and timing of the power disturbance is known.

In some implementations, the correlation analysis (208) includes comparing the data representing the bit errors/retry events (e.g., first data) to the data representing the power disturbances (e.g., second data) to determine if there is a correlation between the bit errors/retry events and the power disturbances. For example, as noted above, data representing the bit errors/retry events within a time window may be compared to data representing the power disturbances within the same time window to determine if there is a correlation between the bit errors/retry events and the power disturbances. The comparisons may be performed for multiple consecutive windows or for selected non-consecutive windows. In another example, data representing the power disturbances at a particular instant in time may be compared to data representing the bit errors/retry events at the same instant in time to determine if there is a correlation between the power disturbances and the bit errors/retry events. The comparisons may be performed for multiple consecutive instants in time or for selected non-consecutive instants in time. Selection of the windows and/or time instants may be programmed into processing device 102 or determined dynamically as described previously In some implementations, positive and/or negative statistical correlation techniques may be used to determine the correlation, or lack thereof, between bit errors/retry events and power disturbances. In some implementations, linear and/or non-linear statistical correlation techniques may be to determine the correlation, or lack thereof, between bit errors and power disturbances. Among the statistical correlation techniques, simple, multiple, and/pr partial statistical correlation techniques may be used to determine the correlation, or lack thereof, between bit errors/retry events and power disturbances. Communication channels having greater bandwidth may be less susceptible to bit errors than communication channels having less bandwidth, which may affect the correlation result. In this regard, in some implementations, processing device 102 is configured to control a bandwidth of the communication channel to affect the correlation. This may be done, e.g., by reducing or increasing the physical media and/or frequencies over which communications occur.

Process 200 stores (209) data representing positive and/or negative correlations, or lack thereof, between the bit errors/retry events and the power disturbances, e.g., along with time data identifying the window and/or time instant when the bit errors/retry events and the power disturbances were detected or occurred. Process 200 may report this information, e.g., by displaying the information on a graphical user interface or by sending the information to an external computing system.

FIG. 3 is a block diagram showing components of example ATE 300 that includes a testing device (referred to herein as a "tester") 301 and a control system 302. The components 100 of FIG. 1 may be part of ATE 300.

Tester 301 includes a test head 303 and a device interface board (DIB) 304 connected physically and electrically to test head 303. In this example, DIB 304 includes a circuit board that includes mechanical and electrical interfaces at sites 305. One or more DUTs, such as DUT 308, connect to each of those sites for testing by the ATE. DUT 308 may be an implementation of DUT 104 of FIG. 1.

DIB 304 may include, among other things, connectors, conductive traces, conductive layers, and circuitry for routing signals between test instruments in the test head 303, DUTs connected to DIB sites, and other circuitry in the ATE. Power, including voltage and current, may be run via one or more layers in the DIB to DUTs connected to the DIB. The power may be provided by power supply 310, which may be an implementation of power supply 112 of FIG. 1.

Test head 303 includes multiple test instruments 311a to 311n, each of which may be configured, as appropriate, to implement testing and/or other functions. Although only four test instruments are shown, ATE 10 may include any appropriate number of test instruments, including one or more residing outside of test head 303. The test instruments may be hardware devices that may include one or more processing devices and/or other circuitry. The test instruments may be configured—for example, programmed—to output commands to test DUTs held on the DIB. The commands to test the DUTs may be or include instructions, signals, data, parameters, variables, test patterns, and/or any other information designed to elicit response(s) from the DUT. In some implementations, all or part of process 200 may be performed in one test instrument or in multiple test instruments—for example, the operations included in FIG. 2 may be distributed across one or more test instruments and/or control system 302.

One or more—for example, all of—the test instruments may be configured to receive, from the DUT, responses to the commands sent from the ATE to the DUT. The responses are in the form of response data. The test instruments may be configured to analyze the response data to determine whether the DUT has passed or failed testing. The test instruments may be configured to send the response data to control system 302 for analysis in accordance with process 200.

Test channels 315 are configured between the test head and the DIB to enable communication between the DUTs and the test instruments. Although only four test channels are shown in FIG. 3, any number of test channels may be included, e.g. one or more test channels per DUT. Communication channel 106 of FIG. 1 may be, or include, one or more of test channels 315.

Control system 302 is configured to—e.g., programmed to—communicate with test instruments 311a to 311n to direct and/or to control testing of the DUTs. In some implementations, this communication 320 link may be over direct connection such as a high-speed serial bus of the type described herein. In some implementations, this communication link may be over a network. In some implementations, this communication link may be considered part of one or more of the test channels. In some implementations, this communication link may not be considered part of one or more of the test channels.

Control system 302 may be configured to provide test programs and/or commands to test instruments 311a to 311n in the test head, which the test instrument(s) use to test the DUTs. Control system 302 may be configured to receive response data from test instrument(s) and to analyze the response data to determine whether DUTs have passed or failed testing. Control system 302 may also be configured to perform all or part of the operations process 200 of FIG. 2 described previously. In this regard, control system 302 may include a power supply controller 325 that monitors, and controls power supplied to the test instrument(s) via power supply 310. Power supply controller 325 may be an implementation of power supply controller 110 of FIG. 1. In some implementations, process 200 may obtain the response data containing bit errors and/or retry events from one or more of the test instruments over link 320.

Memory 323 may store event log 330 which may be an implementation of event log 108 of FIG. 1; and memory 323 may store power log 331 which may be an implementation of power log 114 of FIG. 1. Memory 323 also stores machine-executable instructions 334, such computer code in binary executable form, to implement all or part of process 200 of FIG. 2. For example, processing device 322 either alone (if power supply controller 325 is a component thereof) or in combination with power supply controller 325 (if power supply controller is a separate hardware device) executes instructions 322 to implement all or part of process 200. In implementations where process 200 is performed on test instrument(s), memory 323 and the contents thereof may be included on the test instrument(s).

All or part of the test systems and processes described in this specification and their various modifications may be configured or controlled at least in part by one or more computers such as control system 302 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the test system and processes described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. Automatic test equipment (ATE) for testing a device under test (DUT), the ATE comprising:
   a power supply configured to supply power to the DUT:
   one or more processing devices configured to receive first data from the DUT over a communication channel, and to analyze the first data to identify one or more bit errors in the first data, the first data representing operation of the DUT or an individual component of the DUT based on application of test data to the DUT; and
   a power supply controller configured to receive second data representing a power disturbance in the power supplied to the DUT, the power disturbance comprising a deviation in output of power from the power supply from a predefined norm, and the power disturbance not being intentionally inflicted;
   wherein the one or more processing devices are further configured to determine whether the DUT passed or failed testing based on the first data, to compare the first data and the second data to determine if there is a correlation between the power disturbance and the one or more bit errors, and to report to a user or computing system that the first data on which the testing is based contains bit errors that correlate to the power disturbance in the power supply.

2. The ATE of claim 1, wherein the power supply is configured to operate at voltage levels margined around a nominal voltage of the DUT.

3. The ATE of claim 1, wherein the power supply controller is configured to manage voltage levels at the power supply.

4. The ATE of claim 1, wherein the power supply is configured to have current limits margined around a maximum current draw of the DUT.

5. The ATE of claim 1, wherein the power supply controller is configured to manage current levels at the power supply.

6. The ATE of claim 1, wherein the one or more processing devices are configured to issue commands to the power supply controller to control the power supplied by the power supply to the DUT.

7. The ATE of claim 1, wherein the power supply controller is configured to receive the second data from the power supply.

8. The ATE of claim 7, wherein the power supply controller is configured to timestamp the second data.

9. The ATE of claim 8, wherein the power supply controller is configured to send the timestamped second data to the one or more processing devices.

10. The ATE of claim 1, wherein the power supply controller is configured to store the second data in memory.

11. The ATE of claim 1, wherein the one or more processing devices are configured to store the first data in memory.

12. The ATE of claim 1, wherein the one or more processing devices are configured to timestamp the first data.

13. The ATE of claim 12, wherein the one or more processing devices are configured to send the time-stamped first data to the power supply controller.

14. The ATE of claim 1, wherein the one or more processing devices are configured to use bit error testing to test for the one or more bit errors.

15. The ATE of claim 1, wherein the communication channel comprises a peripheral component interconnect express (PCIe) bus or Ethernet.

16. The ATE of claim 1, wherein the one or more processing devices are configured to control an ambient temperature around the DUT so that the ambient temperature changes from below freezing to above freezing but below a maximum operating temperature of the DUT.

17. The ATE of claim 1, wherein the one or more processing devices are configured to control a bandwidth of the communication channel.

18. A method for testing a device under test (DUT) using automatic test equipment (ATE), the method comprising:

receiving first data from the DUT over a communication channel, the first data representing operation of the DUT or an individual component of the DUT based on application of test data to the DUT;

determining whether the DUT passed or failed testing based on the first data;

analyzing the first data to identify one or more bit errors in the first data;

receiving second data representing a power disturbance in power supplied to the DUT by a power supply, the power disturbance comprising a deviation in output of power from the power supply from a predefined norm, and the power disturbance not being intentionally inflicted;

comparing the first data and the second data to determine if there is a correlation between the power disturbance and the one or more bit errors; and reporting to a user or computing system that the first data on which the testing is based contains bit errors that correlate to the power disturbance in the power supply.

19. The method of claim 18, wherein supplying power to the DUT comprises operating the power supply at voltage levels margined around a nominal voltage of the DUT.

20. The method of claim 18, further comprising managing voltage levels at the power supply.

21. The method of claim 18, wherein the power supply is configured to have current limits margined around a maximum current draw of the DUT.

22. The method of claim 18, further comprising managing current levels at the power supply.

23. The method of claim 18, further comprising issuing commands to a power supply controller to control the power supplied by the power supply to the DUT.

24. The method of claim 18, wherein receiving the second data comprises receiving the second data from the power supply.

25. The method of claim 24, further comprising time-stamping the second data.

26. The method of claim 25, further comprising sending, using a power supply controller, the timestamped second data to one or more processing devices.

27. The method of claim 18, further comprising storing, using a power supply controller, the second data in memory.

28. The method of claim 18, further comprising storing the first data in memory.

29. The method of claim 18, further comprising time-stamping the first data.

30. The method of claim 29, further comprising sending the timestamped first data to a power supply controller.

31. The method of claim 18, further comprising testing, using bit error testing, for the one or more bit errors.

32. The method of claim 18, wherein the communication channel comprises a peripheral component interconnect express (PCIe) bus or Ethernet.

33. The method of claim 18, further comprising controlling an ambient temperature around the DUT so that the ambient temperature changes from below freezing to above freezing but below a maximum operating temperature of the DUT.

34. The method of claim 18, further comprising controlling a bandwidth of the communication channel and wherein comparing comprises detecting correlations between power disturbances and bit errors in the communication channel based on the bandwidth.

* * * * *